(12) United States Patent
Parks

(10) Patent No.: US 7,880,782 B2
(45) Date of Patent: Feb. 1, 2011

(54) IMAGE SENSOR CLOCKING METHOD

(75) Inventor: Christopher Parks, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 354 days.

(21) Appl. No.: 12/130,107

(22) Filed: May 30, 2008

(65) Prior Publication Data

US 2009/0298221 A1    Dec. 3, 2009

(51) Int. Cl.
H04N 9/64    (2006.01)
H04N 3/14    (2006.01)
(52) U.S. Cl. ...................................... 348/243; 348/312
(58) Field of Classification Search ................. None
See application file for complete search history.

(56) References Cited

U.S. PATENT DOCUMENTS

| | | | | |
|---|---|---|---|---|
| 4,709,380 A | * | 11/1987 | Itoh | 377/58 |
| 4,963,952 A | * | 10/1990 | Janesick | 257/223 |
| 5,151,380 A | * | 9/1992 | Hynecek | 438/76 |
| 5,521,405 A | * | 5/1996 | Nakashiba | 257/248 |
| 5,703,642 A | | 12/1997 | Stevens | |
| 5,796,801 A | * | 8/1998 | Nakashiba | 377/60 |
| 5,986,296 A | * | 11/1999 | Caranhac et al. | 257/221 |
| 6,426,238 B1 | * | 7/2002 | Morimoto | 438/52 |
| 6,586,784 B1 | | 7/2003 | Parks | |
| 7,015,520 B1 | * | 3/2006 | Parks | 257/246 |

* cited by examiner

Primary Examiner—Justin P Misleh
(74) Attorney, Agent, or Firm—Peyton C. Watkins; Nancy R. Simon

(57) ABSTRACT

A method for reducing dark current within a charge-coupled device, the method includes each gate phase n having a capacitance $C_n$, voltage change on the gate phase n given by $\Delta V_n$ such $$\sum_n C_n \Delta V_n \cong 0;$$

for the first time period, maintaining a set of first gate phases holding charge in the accumulated state and maintaining a set of second gate phases not holding charge in the depleted state; for a second time period, clocking the charge into a set of third gate phases in the depleted state and clocking the second set of gate phases not holding charge into the accumulated state; for a third time period, clocking the third set of gate phases holding the charge into the accumulated state and clocking a fourth set of gates not holding the charge into the depletion state; wherein the second time period is shorter than the first and third time periods.

3 Claims, 9 Drawing Sheets

IMAGE SENSOR CLOCKING METHOD

FIELD OF THE INVENTION

The invention relates generally to the field of image sensors having charge-coupled devices, and in particular to a method for reducing dark current in charge-coupled devices.

BACKGROUND OF THE INVENTION

FIG. 1 shows charge transfer through a 4-phase charge-coupled device (CCD). The CCD consists of 4 gates V1, V2, V3, and V4 that control the flow of electrons through an n-type buried channel 105 in a p-type well 106 which is in an n-type substrate 107. At each time step T1 through T5 in FIG. 1, a channel potential diagram is drawn indicating where charge is located in the CCD. The voltages on the gate V1 through V4 at each time step are shown in FIG. 2. As charge moves through the CCD, there is no time at which the charge is held in an accumulated state. The accumulated state is when the gate voltage is low enough with respect to the p-type well or n-type substrate 107 to cause the accumulation of opposite electron charge carries (holes) at the surface of the buried channel 105. The accumulation of holes at the surface is well known to suppress dark current generation in CCDs. At all times in FIGS. 1 and 2, the charge packet is held under gates which are in the depleted state. The depleted state is when the gate voltage is high and prevents the accumulation of holes at the surface. That causes high dark current generation in the CCD and degrades quality of an image stored in the CCD.

FIG. 3 shows the clocking of charge through a similar CCD as FIG. 1. The difference being the presence of barrier implants 103 and 104 in the buried channel 102. The buried channel 102 is also built in a p-type well 100 on an n-type substrate 101. In this CCD, a different clocking scheme can used as shown in FIG. 4. At time T1 all of the CCD gates are at the low voltage level causing all gates to be accumulated with holes for low dark current. The barrier implants 103 and 104 keep the charge packet from flowing along the CCD. From times T2 through T6 the gates are clocked into the higher voltage depleted state for a short amount of time to advance the charge forward through the COD. Then at time T7, all gates are returned to the accumulated state for dark current suppression. By clocking the charge quickly between times T1 and T7 a minimal amount of dark current is added to the charge packet.

As disclosed by U.S. Pat. No. 6,586,784, the clock diagram in FIG. 4 has a shortcoming with uncompensated clock edges. Between times T1 and T2 gates V3 and V4 are both clocked with rising edges and no other clock has equal compensating falling edges. The gates V1 through V4 have a capacitance with the p-type well 100. If there are an equal number of rising edges as there are falling edges then the capacitive coupling of the gates V1 through V4 to the p-type well 100 are cancelled out. But the rising edges of the V3 and V4 gate timing of FIG. 4 between times T1 and T2 are not cancelled out. This will cause the p-type well 100 voltage to 'bounce' and cause poor charge transfer or even loss of charge in the CCD.

U.S. Pat. No. 6,585,784 solves the p-well bounce problem by clocking the gates V1 through V4 with three voltage levels as shown in FIG. 5. The voltage levels and timing are chosen such that $$\sum_n C_n \Delta V_n \cong 0.$$

$C_n$ is the capacitance of gate n to the p-type well 100, and $\Delta V_n$ is the change in clock voltage on gate n, where n is the number 1 through 4 corresponding to gates V1 through V4. The problem with this three level voltage solution is how to create a clock driver that outputs three voltage levels. It can be done with discrete electronic components, but they are costly compared to integrated circuit clock drivers. However, the integrated circuit clock drivers available can only generate two voltage levels, not the required three levels.

The present invention described herein will allow for low dark current clocking of a CCD with no p-well bounce while only requiring two voltage level clock drivers. The present invention enables the use of inexpensive integrated clock drivers for low dark current CCD clocking.

SUMMARY OF THE INVENTION

The present invention is directed to overcoming one or more of the problems set forth above. Briefly summarized, according to one aspect of the present invention, the A method for reducing dark current within a charge-coupled device, the method includes providing at least four gate phases separated by an insulating layer from a buried channel of the first conductivity type in a well or substrate of the second conductivity type; providing a storage and barrier region under each gate phase for separating charge packets when in the accumulation state; clocking the gate phases at only two voltage levels for advancing the charge through the charge-coupled device; wherein at each gate phase n having a capacitance $C_n$ to the layer of a second conductivity type, a voltage change on the gate phase n given by $\Delta V_n$ such that the sum of products of the capacitances and voltage changes is zero or substantially zero $$\sum_n C_n \Delta V_n \cong 0;$$

for the first time period, maintaining a set of first gate phases holding photogenerated charge in the accumulated state and maintaining a set of second gate phases not holding photogenerated charge in the depleted state; for a second time period, clocking the photogenerated charge into a set of third gate phases in the depleted state and clocking the second set of gate phases not holding photogenerated charge into the accumulated state; for a third time period, clocking the third set of gate phases holding the photogenerated charge into the accumulated state and clocking a fourth set of gates not holding the photogenerated charge into the depletion state; wherein the second time period is shorter or substantially shorter then the first and third time periods.

These and other aspects, objects, features and advantages of the present invention will be more clearly understood and appreciated from a review of the following detailed description of the preferred embodiments and appended claims, and by reference to the accompanying drawings.

ADVANTAGEOUS EFFECT OF THE INVENTION

The present invention has the advantage of reducing dark current in image sensors using low cost integrated circuit clock drivers for clocking the CCD.

DETAILED DESCRIPTION OF THE INVENTION

Figure 1:
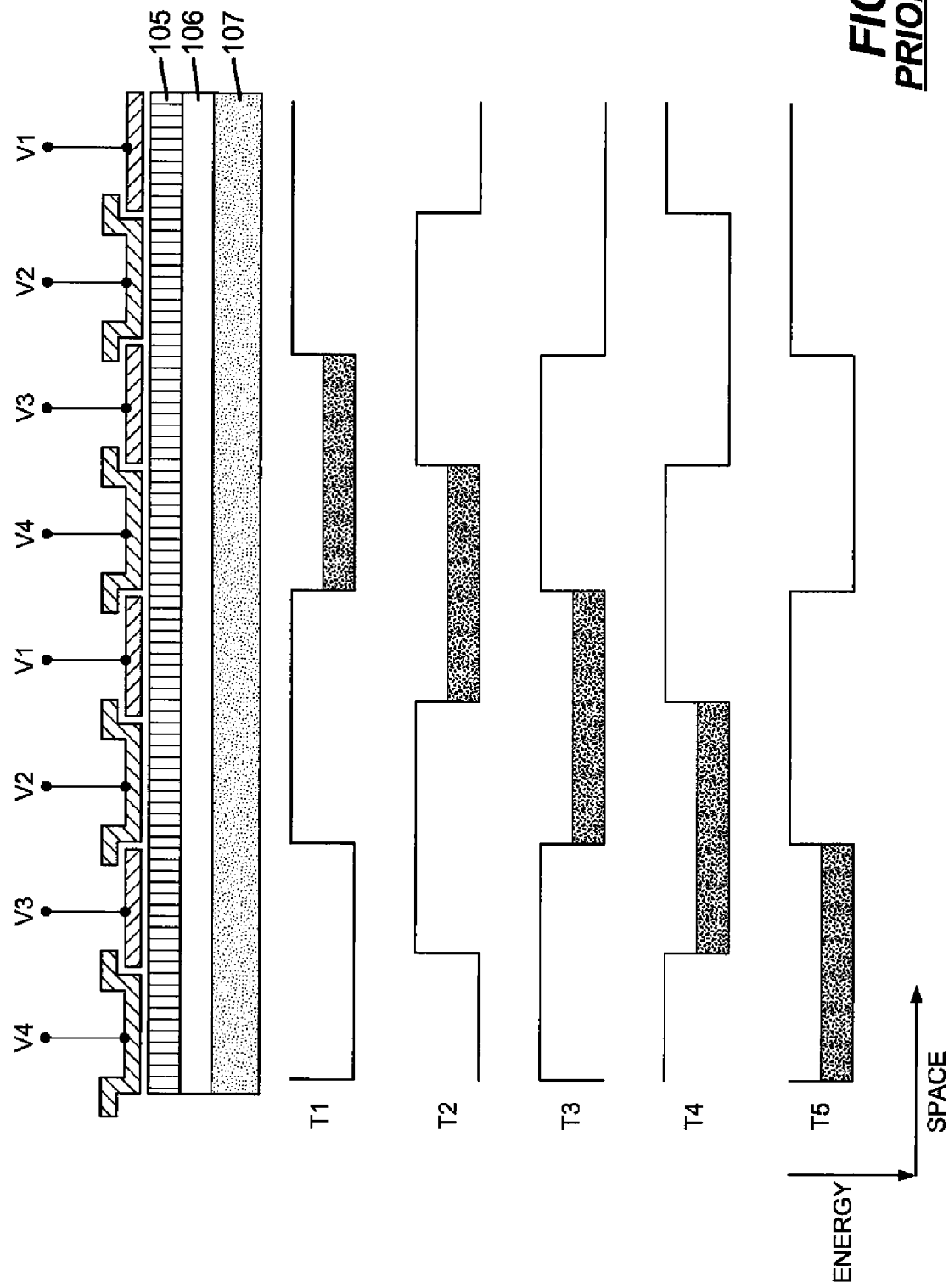
FIG. 1 is a prior art image sensor illustrating charge transfer.
Figure 2:
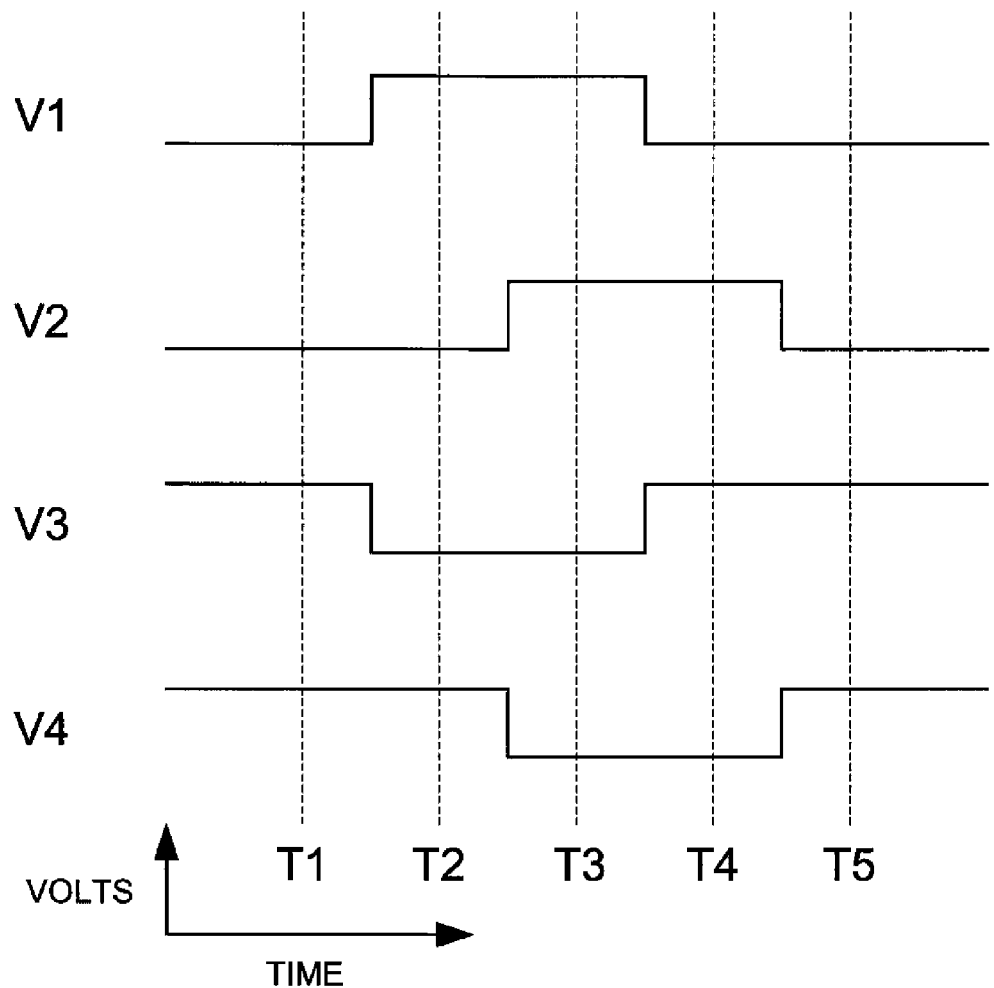
FIG. 2 is a timing diagram for the image sensor of FIG. 1.
Figure 3:
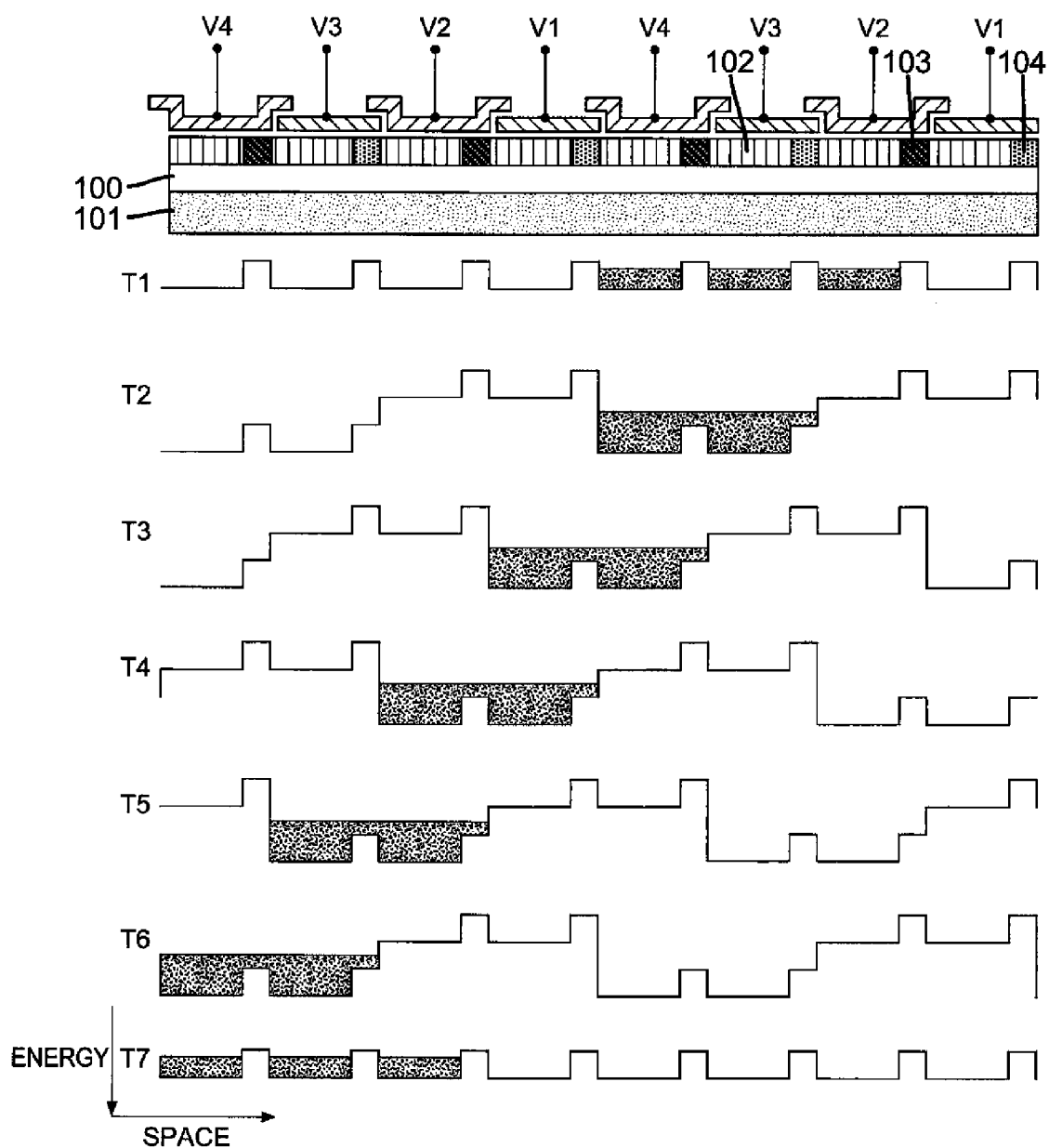
FIG. 3 is another prior art image sensor illustrating charge transfer.
Figure 4:
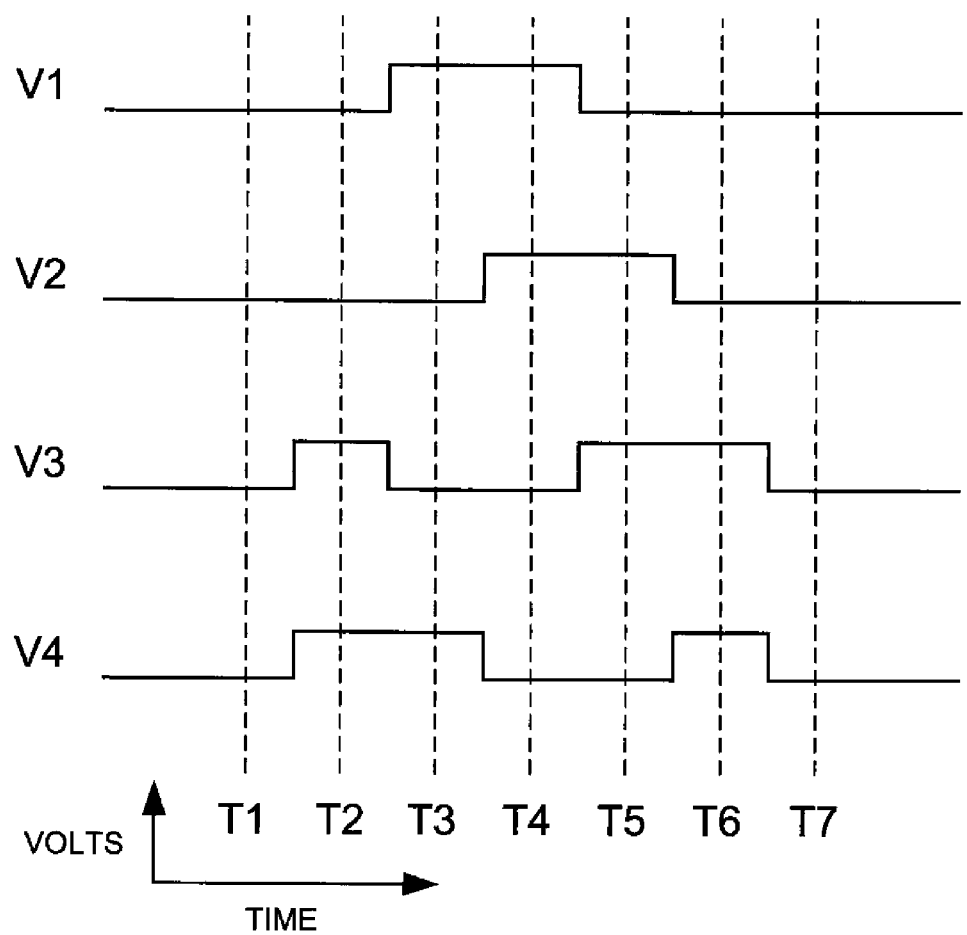
FIG. 4 is a timing diagram for the image sensor of FIG. 3.
Figure 5:
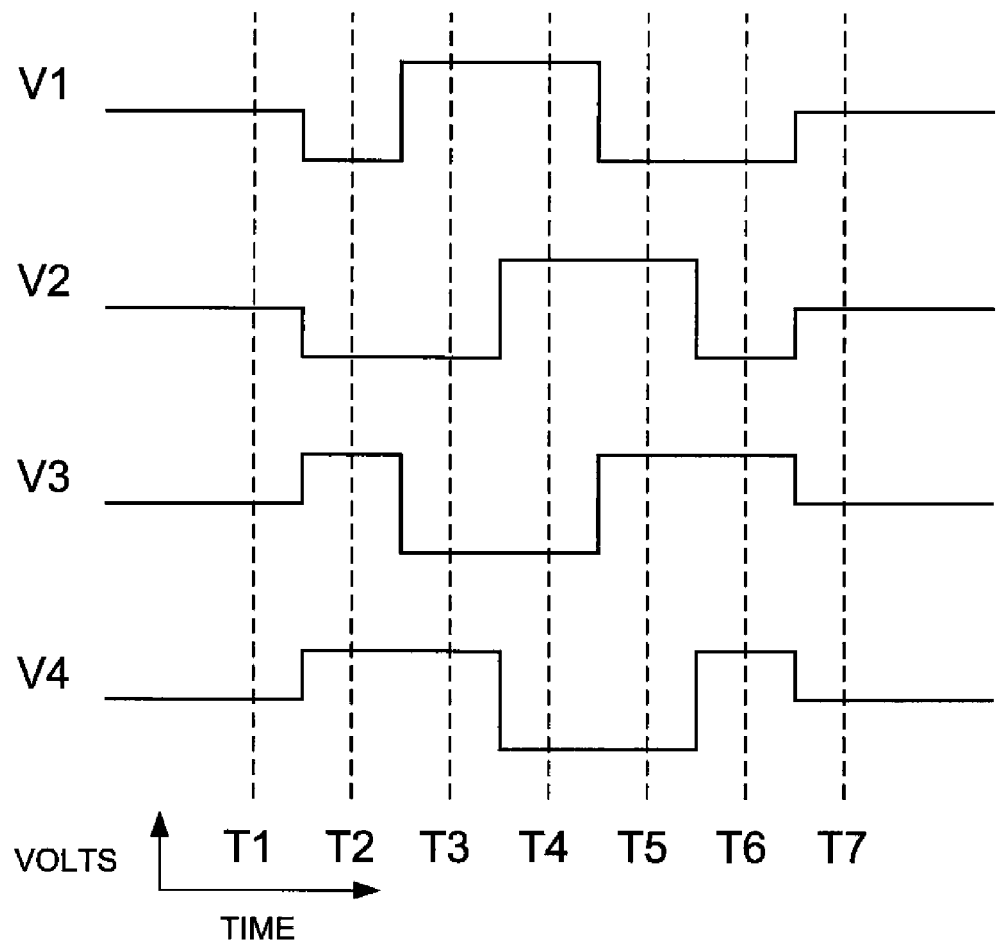
FIG. 5 is a timing diagram for a prior art image sensor.
Figure 6:
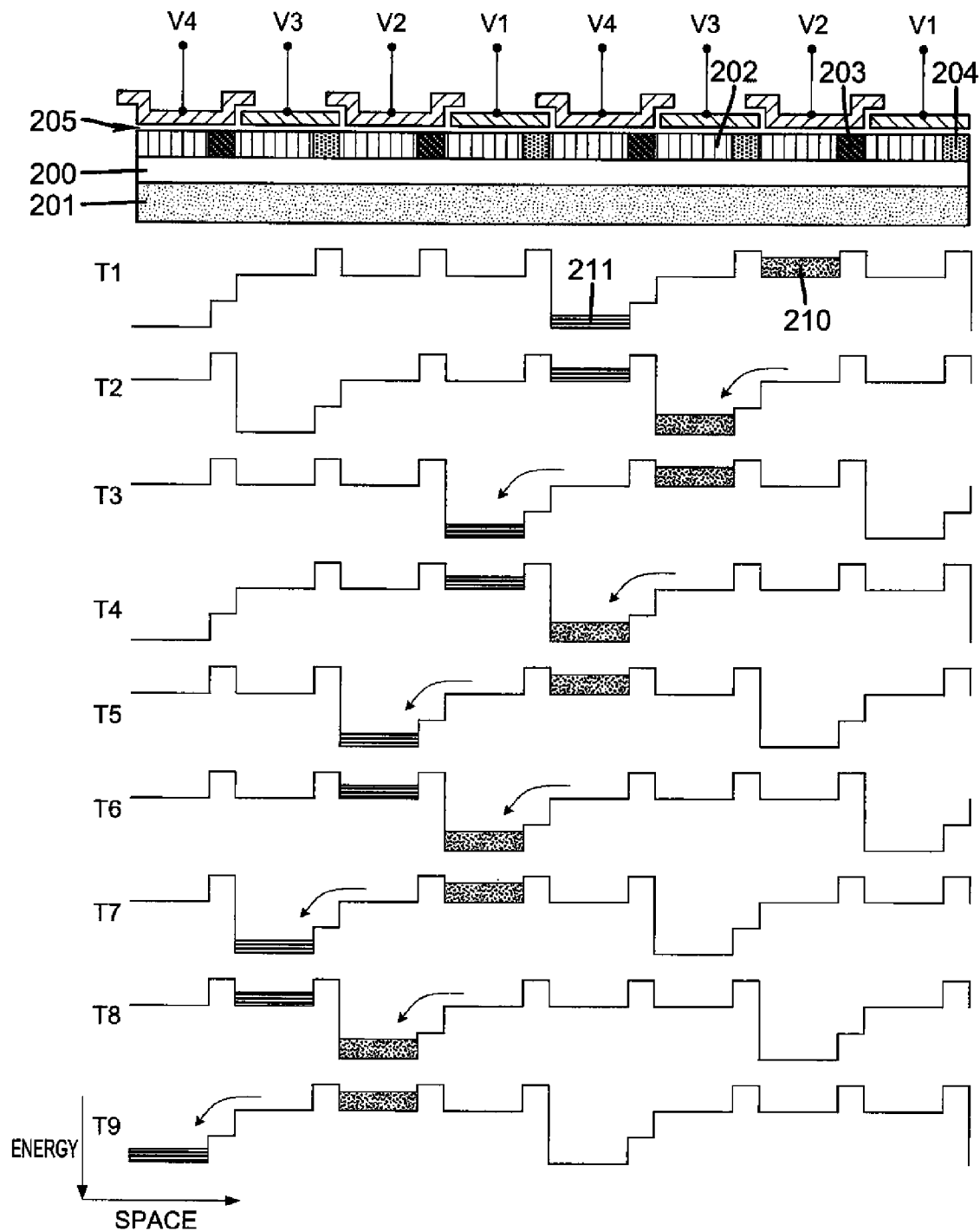
FIG. 6 is an image sensor of the present invention illustrating charge transfer.
Figure 7:
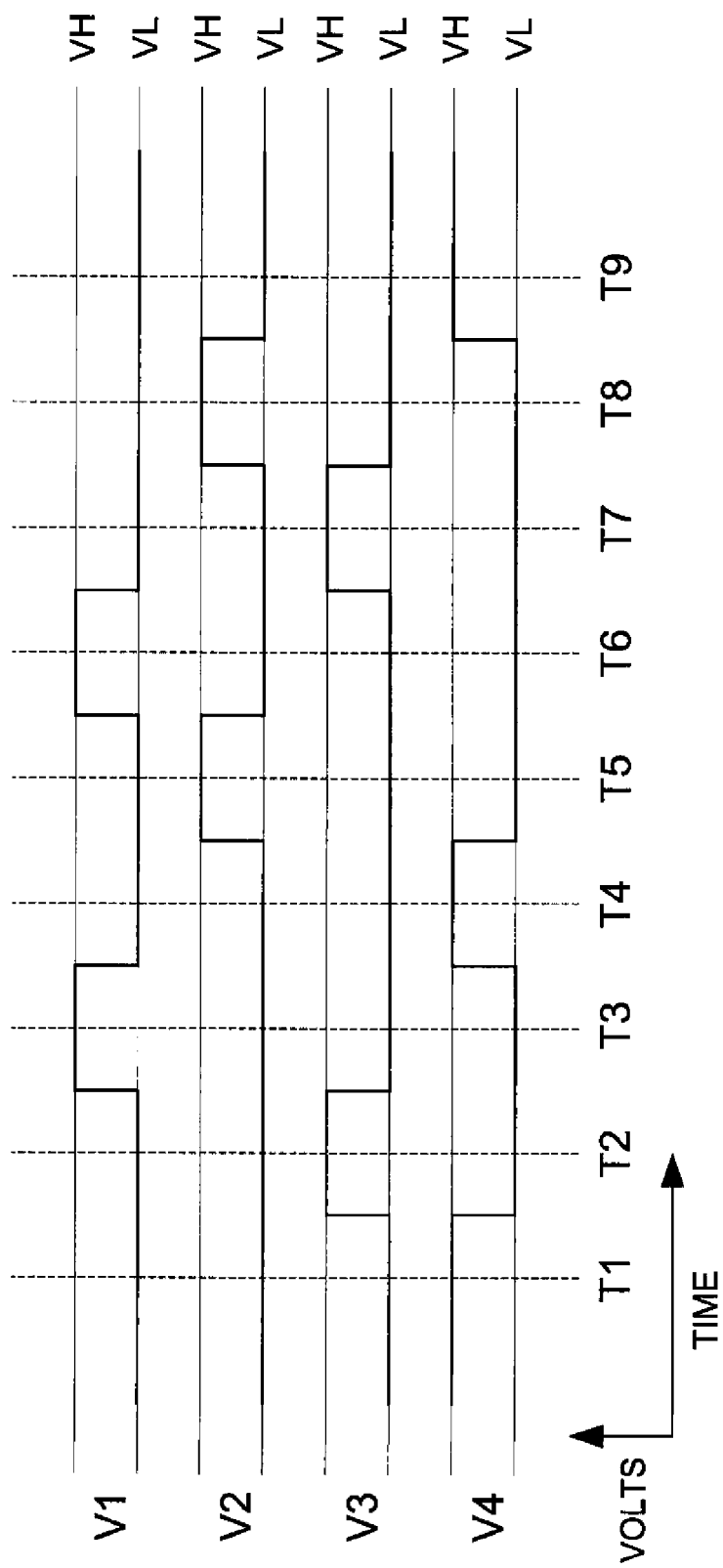
FIG. 7 is a timing diagram for FIG. 6.

FIG. 6 shows the charge flow and FIG. 7 shows the gate timing of the first embodiment of the present invention. This embodiment is an example of two-level accumulation mode clock timing of a 4-phase CCD.

As shown in FIG. 6 the 4-phase CCD consists of 4 gates V1, V2, V3, and V4. Under each gate is a buried CCD channel 202 built in a p-type well 200 on an n-type substrate 201. Within the buried CCD channel 202 are barrier implants 203 and 204 that keep charge packets separated when gates are in accumulation. An insulating layer 205 separates the gates from the buried CCD channel 202. This timing is such that there is always at least one gate held in the depleted state. At time T1 this is gate V4. The charge packet 211 is unwanted charge that has been generated by dark current. The charge packet 210 is the desired photogenerated charge held under the accumulated gate V2. The accumulated gate V2 has a low dark current generation rate and is placed into accumulation by applying a low voltage at time T1 as indicated by FIG. 7.

To advance the charge packet 210 forward by one gate phase, the V3 gate is clocked high at time T2. To prevent p-well bounce the depleted gate V4 is clocked low at the same time. Then gate V4 is clocked low and back to the accumulated state at time T3. To compensate, gate V1 is clocked high at the same time. That also advances the charge packet containing dark current forward one phase. This process is repeated until time step T9 when charge packet 210 has advanced through all 4-phases to the next V2 gate. Throughout the entire clocking sequence the dark current charge packet 211 is advanced ahead of the photogenerated charge packet 210. Now the CCD clocking can be stopped for an extended period of time without collecting too much dark current in the photogenerated charge packet 210. Instead the charge packet 211 collects the dark current because it is under the gate held in the depleted state. The 'dummy' dark current charge packet 211 is maintained to provide a gate for compensating the clock edges of the gates holding the desired photogenerated charge packet 210.

At the end of the CCD there is charge measuring circuit (not shown in the Figure). The dark current charge packet 211 is discarded and the charge value measured in packet 210 is kept.

Figure 8:
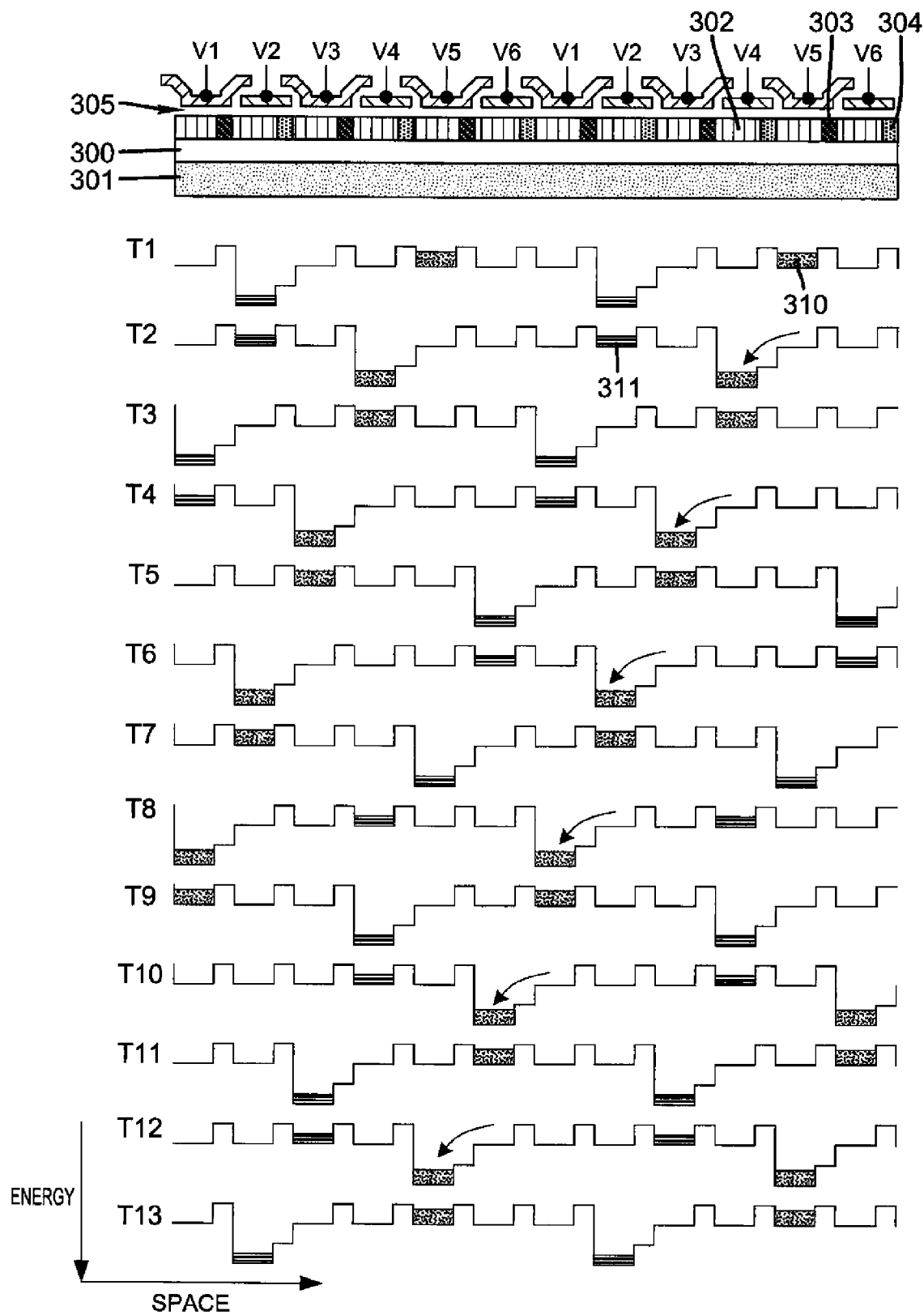
FIG. 8 is an alternative embodiment of an image sensor of the present invention illustrating charge transfer.

FIG. 8 shows the alternative embodiment of the present invention applied to a 6-phase CCD. The 6-phase CCD has six control gates V1 through V6 that control charge flow through an n-type buried channel 302. The buried channel 302 is in a p-type well 300 on an n-type substrate 301. The buried channel 302 has barrier implants 303 and 304 under alternating gates to kept charge packets separated when the gates are clocked into accumulation. The gates are separated from the buried channel 302 by in insulating layer 305.

There is one dark current charge packet 311 under gate V2 in the depleted state and a photogenerated charge packet 310 under a gate V5 in the accumulated state. The dark current charge packet 311 under a gate in depletion exists to provide a means of compensating clock edges for the gate used to clock the photogenerated charge packet 310. When the gate one gate ahead of the photogenerated charge packet 310 is clocked into depletion (rising edge) the gate over the dark current charge packet 311 is clocked into accumulation (falling edge). This causes the photogenerated charge packet 310 to advance by one gate. When the gate over the photogenerated charge packet 310 is clocked back into accumulation (falling edge) the gate one gate ahead of the dark current charge packet 311 is clocked into depletion (rising edge). This causes the dark current charge packet 311 to advance by one gate.

Figure 9:
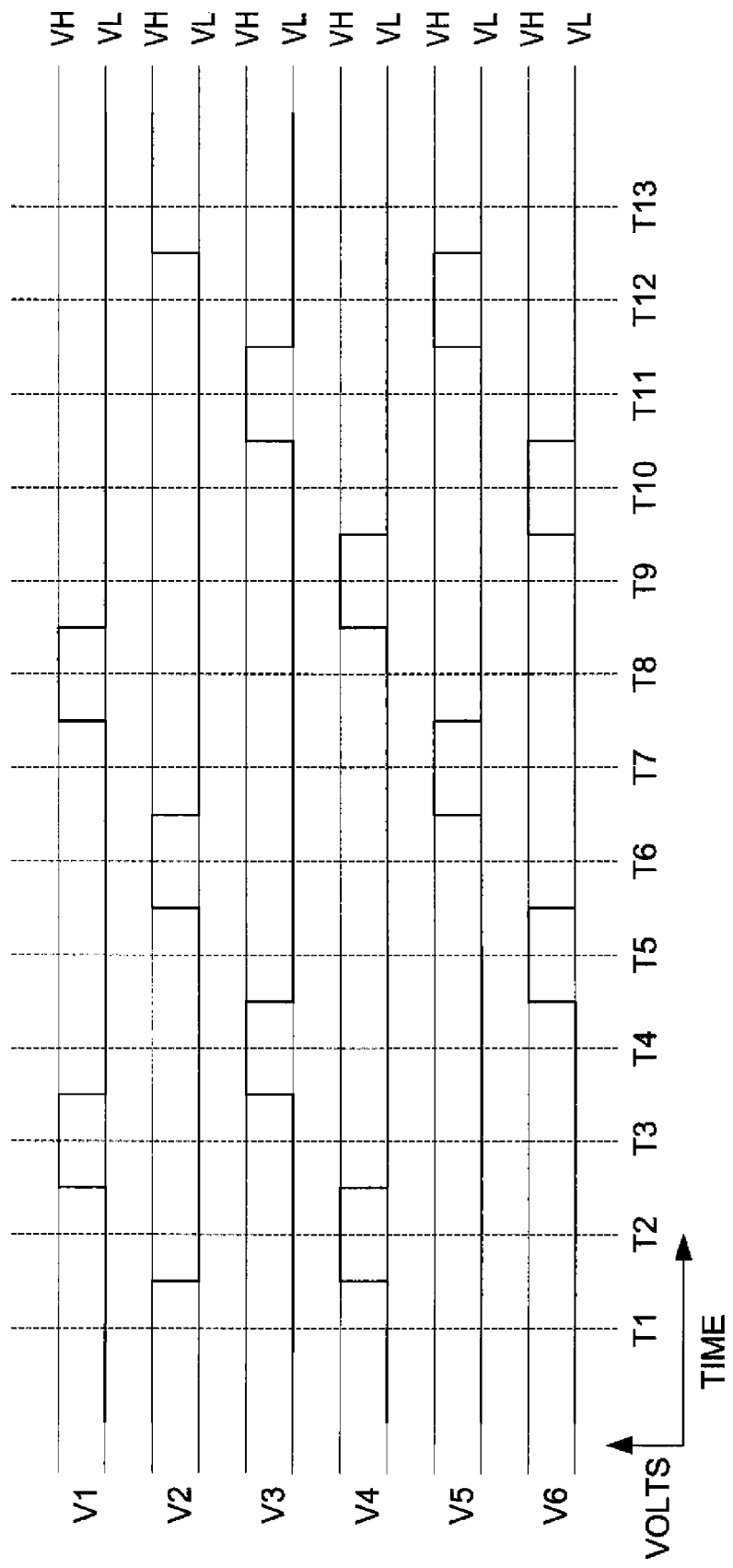
FIG. 9 is a timing diagram for FIG. 8.

This process is repeated until the photogenerated charge packet 310 has advanced by all 6-phases of the CCD. The clocking process from times T1 to T13 in FIG. 9 takes place rapidly and is of a much shorter time scale than when the CCD is idle at times T1 or T13. The CCD spends the majority of time with the gate over the photogenerated charge packet in the accumulation state.

The present invention is not limited to the case where only one gate is used to store the photogenerated charge packet or the dark current charge packet. More than one gate may be held in depletion and more than two gates can be clocked at one time. The generalized case would be a CCD having a collection of n gates where there is one set of at least one gate held in the depletion state and holds a charge packet that collects dark current. Furthermore, there is a second set of at least one gate held in the accumulation state and holds a photogenerated charge packet. To advance the charge packet by one phase, the gates are clocked in a complimentary manner such that the photogenerated charge packet enters the depletion state for only a very short period of time (a few microseconds). Also, the clocking of the gates to advance the charge packet is done according to $$\sum_n C_n \Delta V_n \cong 0,$$

where $C_n$ is the capacitance of gate n to the p-type well 100, and $\Delta V_n$ is the change in clock voltage on gate n. n can be any integer 3 or larger.

The preferred embodiments of the invention have been described in the context of electrons has majority charge carriers in the CCD. It is well known that it is equivalent to change the polarity of all the implants and voltages to allow use of holes as majority charge carriers in the CCD.

The invention has been described with reference to a preferred embodiment. However, it will be appreciated that variations and modifications can be effected by a person of ordinary skill in the art without departing from the scope of the invention.

PARTS LIST 100 p-type well
101 n-type substrate
102 buried channel
103 barrier implants
104 barrier implants
105 buried channel
106 p-type well
107 n-type substrate
200 p-type well
201 n-type substrate
202 CCD channel
203 barrier implants
204 barrier implants
205 insulating layer
210 charge packet
211 dark current charge packet
300 p-type well
301 n-type substrate
302 n-type buried channel
303 barrier implant
304 barrier implant
310 photogenerated charge packet
311 dark current charge packet

The invention claimed is:
1. A method for reducing dark current within a charge-coupled device, the method comprising:
   a) providing at least four gate phases separated by an insulating layer from a buried channel of a first conductivity type in a well or substrate of a second conductivity type;
   b) providing a storage and barrier region under each gate phase for separating charge packets when in an accumulation state;
   c) clocking the gate phases at only two voltage levels for advancing the charge packets through the charge-coupled device such that a sum of products of capacitances and voltage changes is zero or substantially zero according to

$$\sum_n C_n \Delta V_n \cong 0,$$

where $C_n$ is a capacitance of gate phase n to the well or substrate of the second conductivity type and $\Delta V_n$ is a voltage change on the gate phase n, wherein
   for a first time period, maintaining a set of first gate phases holding photogenerated charge packets in the accumulated state and maintaining a set of second gate phases not holding photogenerated charge packets in a depleted state;
   for a second time period, clocking the photogenerated charge packets into a set of third gate phases in the depleted state and clocking the second set of gate phases not holding photogenerated charge packets into the accumulated state; and
   for a third time period, clocking the third set of gate phases holding the photogenerated charge packets into the accumulated state and clocking a fourth set of gates not holding the photogenerated charge packets into the depletion state; wherein the second time period is shorter or substantially shorter than the first and third time periods.

2. The method as in claim 1, wherein step a) includes four gates which repeat to form the charge-coupled device.

3. The method as in claim 1, wherein step a) includes six gates which repeat to form the charge-coupled device.

* * * * *